(12) United States Patent
Mehrotra (10) Patent No.: US 11,532,758 B2
(45) Date of Patent: Dec. 20, 2022

(54) LOW LEAKAGE SCHOTTKY DIODE

(71) Applicant: TEXAS INSTRUMENTS INCORPORATED, Dallas, TX (US)

(72) Inventor: Manoj Mehrotra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 62 days.

(21) Appl. No.: 16/581,044

(22) Filed: Sep. 24, 2019

(65) Prior Publication Data
US 2021/0091237 A1 Mar. 25, 2021

(51) Int. Cl.
*H01L 29/872* (2006.01)
*H01L 29/40* (2006.01)
*H01L 29/66* (2006.01)
*H01L 29/417* (2006.01)
*H01L 29/47* (2006.01)

(52) U.S. Cl.
CPC ........ *H01L 29/8725* (2013.01); *H01L 29/401* (2013.01); *H01L 29/417* (2013.01); *H01L 29/47* (2013.01); *H01L 29/66143* (2013.01)

(58) Field of Classification Search
CPC . H01L 29/8725; H01L 29/401; H01L 29/417; H01L 29/47; H01L 29/66143
See application file for complete search history.

(56) References Cited

U.S. PATENT DOCUMENTS

| | | | |
|---|---|---|---|
| 5,365,102 A | 11/1994 | Mehrotra et al. | |
| 2010/0207232 A1* | 8/2010 | Zhu | H01L 29/2003 257/473 |
| 2011/0084353 A1* | 4/2011 | Chao | H01L 21/2256 257/484 |
| 2012/0098082 A1* | 4/2012 | Hsu | H01L 29/872 257/471 |
| 2012/0168893 A1* | 7/2012 | Liu | H01L 29/66143 257/471 |
| 2014/0361398 A1* | 12/2014 | Higashida | H01L 29/0619 257/471 |
| 2015/0236172 A1* | 8/2015 | Quddus | H01L 29/8725 257/471 |
| 2015/0380570 A1* | 12/2015 | Tanaka | H01L 29/0619 257/471 |
| 2016/0056284 A1* | 2/2016 | Goerlach | H01L 29/4916 257/330 |
| 2016/0268255 A1* | 9/2016 | Qu | H01L 29/66143 |

* cited by examiner

*Primary Examiner* — Lex H Malsawma
(74) *Attorney, Agent, or Firm* — Yudong Kim; Charles A. Brill; Frank D. Cimino (57) ABSTRACT

A method includes forming first and second trenches in a semiconductor substrate. The method further includes filling the first and second trenches with polysilicon. The polysilicon is oppositely doped from the semiconductor substrate. A Schottky contact is formed on the semiconductor substrate between the first and second trenches. The method also includes forming an anode for the Schottky contact. The anode is coupled to the polysilicon in the first and second trenches.

21 Claims, 9 Drawing Sheets

LOW LEAKAGE SCHOTTKY DIODE

BACKGROUND

A Schottky diode is a semiconductor diode formed by the junction of a semiconductor and a metal. The metal-semiconductor junction creates a Schottky "barrier," The metal forms the diode's anode, and the semiconductor forms the diode's cathode. As such, forward current (when the diode is forward biased) is from metal/anode to semiconductor/cathode. The Schottky barrier results in relatively fast switching and low forward voltage drop as compared to a semiconductor-semiconductor (p-n) junction. The forward voltage drop of a Schottky barrier may be in the range of, for example, 150 to 450 mV, The reverse recovery time of a Schottky barrier (when the diode switches from the conducting to the non-conducting state) is significantly lower than for a p-n junction. Because of the relatively low forward voltage and fast switching speed of a Schottky diode, Schottky diodes are often used in applications such as voltage clamps, transistor saturation prevention, power systems to prevent, for example, batteries from discharging through solar panels at night, rectifiers in switching voltage regulators, sample-and-hold circuits, and other applications.

Because of the low forward voltage of a Schottky diode, Schottky diodes also are characterized by higher reverse leakage current than p-n junctions. Reverse leakage current is the current that flows through the Schottky diode when the Schottky diode is reverse biased. The electric field around the metal-semiconductor interface of a Schottky diode is relatively high due to the sharp edges of the Schottky contact, and reverse leakage current is proportional to the electric field. As such, a higher electric field means higher reverse leakage current of a Schottky diode relative to a p-n junction.

SUMMARY

In one example, a method includes forming first and second trenches in a semiconductor substrate. The method further includes filling the first and second trenches with polysilicon. The polysilicon is oppositely doped from the semiconductor substrate. A Schottky diode is created by forming a Schottky contact on the semiconductor substrate between the first and second trenches. The method also includes forming an anode electrode for the Schottky diode. The anode electrode is formed on the Schottky contact and coupled to the polysilicon in the first and second trenches.

BRIEF DESCRIPTION OF THE DRAWINGS

For a detailed description of various examples, reference will now be made to the accompanying drawings in which.

DETAILED DESCRIPTION

Figure 1:
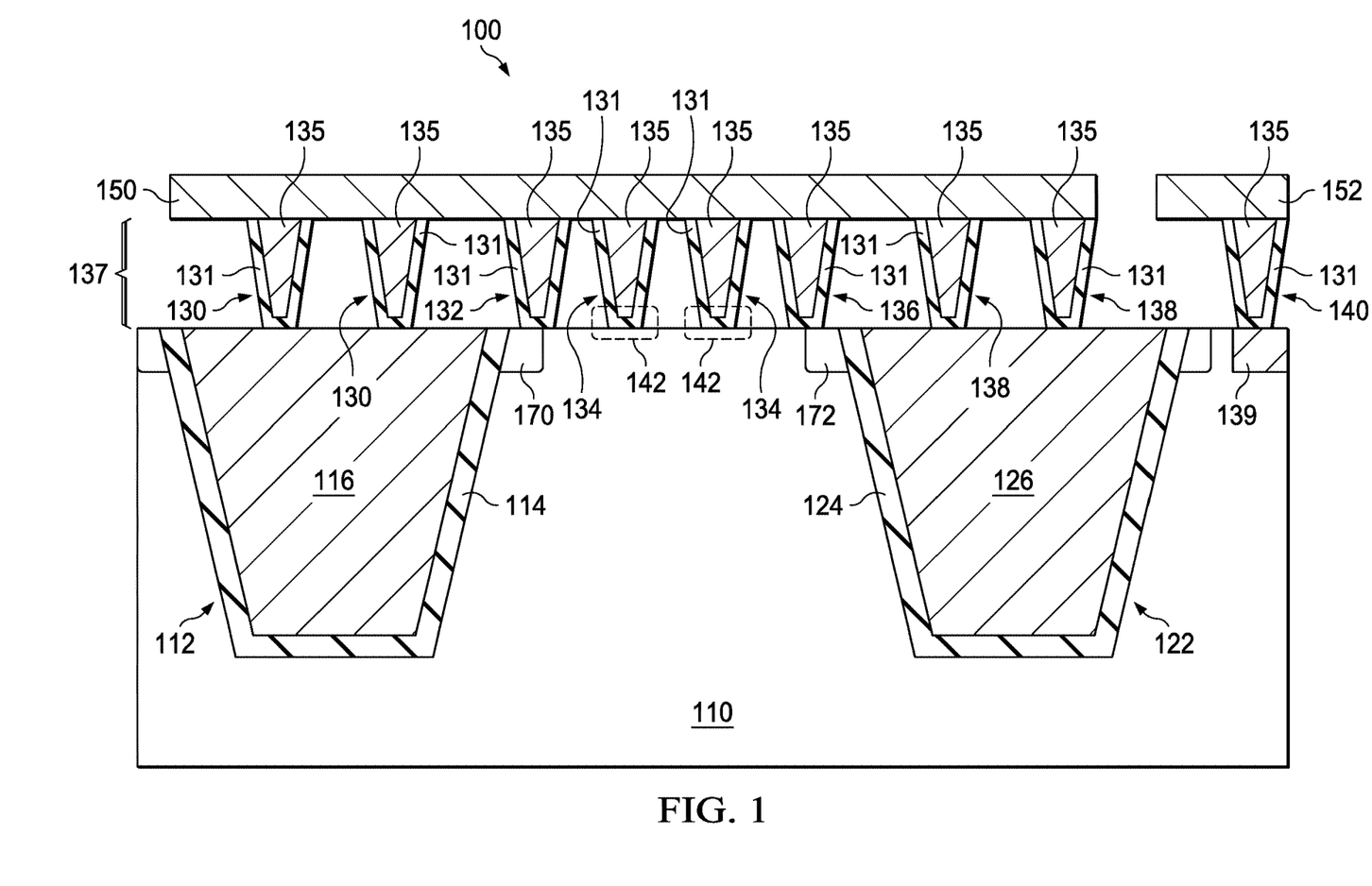
FIG. 1 illustrates a Schottky diode in accordance with one example.

FIG. 1 shows an example a Schottky diode 100. In this example, Schottky diode 100 includes a silicon substrate 110 (e.g., N-type). Trenches 112 and 122 have been etched in the silicon substrate. Trench 112 is lined with a layer 114 of oxynitride (or other suitable dielectric material). The trench 112 is then filled with polycrystalline silicon 116 ("polysilicon"). In one example, the silicon substrate 110 is N-doped and the polysilicon 116 is P-doped. Similarly, trench 122 is lined with a layer 124 of oxynitride, and then filled with polysilicon 126. The oxynitride 114 in trench 112 and the oxynitride 124 in trench 122 may be formed during the same process step. Similarly, the polysilicon 116 in trench 112 and the polysilicon 126 in trench 122 also may be formed during the same process step.

Referring still to FIG. 1, contact plugs 130, 132, 134, 136, 138, and 140 are formed over the silicon substrate 110. Each contact plug 130, 132, 134, 136, 138, and 140 is lined with a titanium/titanium-nitride (Ti/TiN) barrier 131 and then filled with, for example, tungsten 135. In one example, a sacrificial oxide layer 137 is formed over the silicon substrate 110 and cavities for the contact plugs are etched in the oxide layer 137. A layer of Ti/TiN 131 is deposited within the cavities, and then the cavities are filled with tungsten 135. The sacrificial oxide layer 137 is then removed. The Schottky diode 100 further includes an anode electrode 150 in contact with contact plugs 130-138 and a cathode electrode 152 in contact with the contact plug 140. The anode electrode 150 is coupled to the polysilicon 116, 126 in trenches 112, 122, respectively, by way of contact plugs 130 and 138. The Ti/TiN layer 131 of plug 140 contacts a metal layer 139 (e.g., a silicide such as cobalt silicide, nickel silicide, etc.) rather than the semiconductor substrate 110 so as to form an ohmic contact instead of a Schottky barrier. Contact plugs 130 are in contact with the polysilicon 116 of trench 112. Contact plugs 138 are in contact with the polysilicon 126 of trench 122. Two contact plugs 134 are shown in contact with the silicon substrate 110 in this example. In general, any number of contact plugs 134 (one or more) can be formed to be in contact with the silicon substrate 110 depending on electric current needs of the application in which the Schottky diode 100 will be used.

The Ti/TiN layer 131 for contact plugs 134 are in contact with the silicon substrate 110 and thus form Schottky contacts in region 142 as shown. The combination of polysilicon 116 (e.g., P-doped), oxynitride 114, and the silicon substrate 110 (e.g., N-doped) forms a first gated diode region. Similarly, the combination of polysilicon 126 (e.g., P-doped), oxynitride 124, and the silicon substrate 110 forms a second gated diode region. The polysilicon 116, 126 functions as a gate to control the electric field within the substrate 110 when the Schottky diode 100 is reversed biased. When the Schottky diode 110 is reversed biased (i.e., a negative voltage is placed on the anode electrode 150 with respect to the cathode electrode 152), the voltage on the polysilicon 116/126 is at a lower voltage than the substrate 110. As such, the electric field in regions 142 of the Schottky contacts is reduced due to a charge sharing effect or a field plate effect. As a result of reduction in the electric field in regions 142, reverse leakage current (i.e., flow current between anode electrode 150 and cathode electrode 152 when the Schottky diode is reverse biased) also is advantageously reduced without increasing the forward voltage when forward biased.

The example of FIG. 1 also illustrates p-doped regions 170 and 172, which form p-n junctions with respect to the n-doped silicon substrate 110. The p-n junctions formed between p-doped region 170 and n-doped substrate 110 and between p-doped region 172 and substrate 110 is also reversed biased when the Schottky diode 110 is reverse biased which helps to further reduce the electric field and thus further reduce reverse leakage current.

Figure 2:
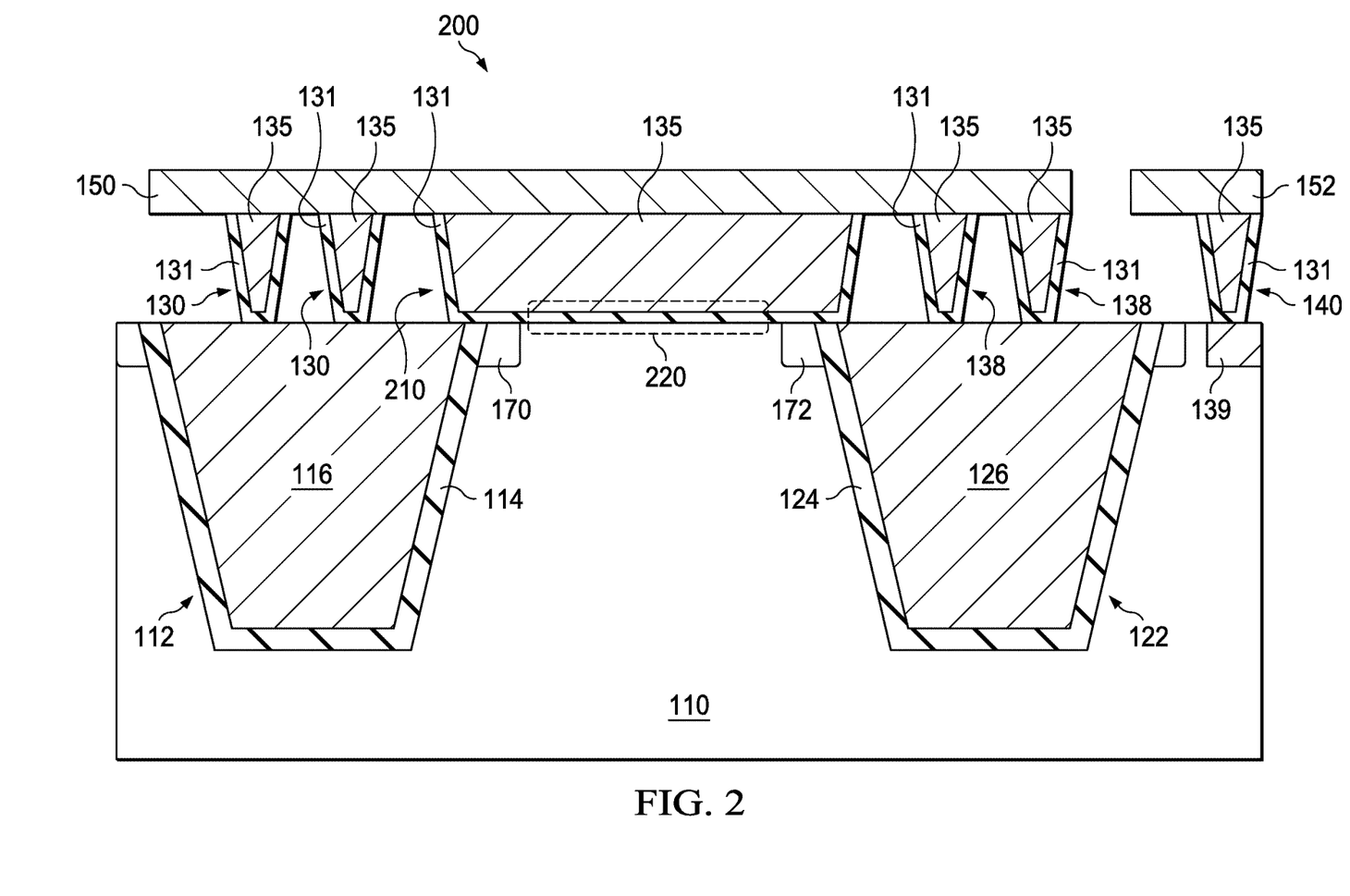
FIG. 2 illustrates a Schottky diode in accordance with another example.

FIG. 2 shows an example of a Schottky diode 200 similar to that of FIG. 1, but with one larger plug 210 instead of multiple smaller plugs 132, 134, and 136 between trenches 112 and 122. The single larger plug 210 in this example comprises a thin Ti/TiN layer and is filled with Tungsten as was the case for plugs 132, 134, and 136 of FIG. 1. A single Schottky contact 220 is formed between the Ti—TiN layer 131 and the semiconductor substrate 110. Because the plug 210 in FIG. 2 has a larger surface area in contact with the silicon substrate 110, the Schottky diode 200 of FIG. 2 is capable of providing higher current levels than that of FIG. 1, all else being equal.

Figure 3:
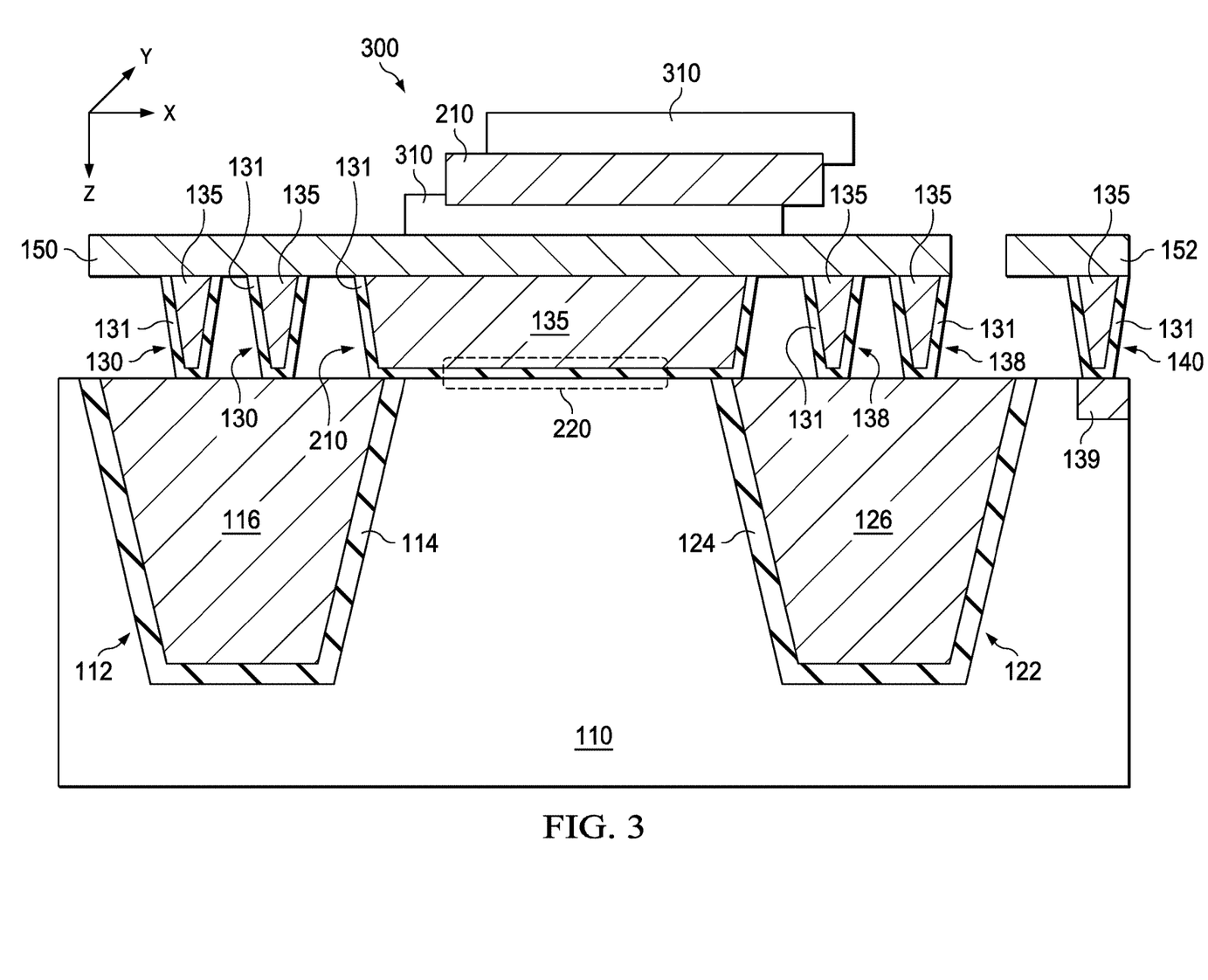
FIG. 3 illustrates a Schottky diode in accordance with yet another example.

FIG. 3 illustrates an example of a Schottky diode 300 similar to that of FIG. 2, but with P-doped regions 310 formed in the y-direction between adjacent Tungsten-filled plugs 210. Thus, the structure shown in FIG. 3 comprises alternating Schottky contacts 220 separated in the y-direction by P-doped regions 310. The P-doped regions 310 help to further reduce the electric field in the region around each Schottky contact 220.

Figure 4:
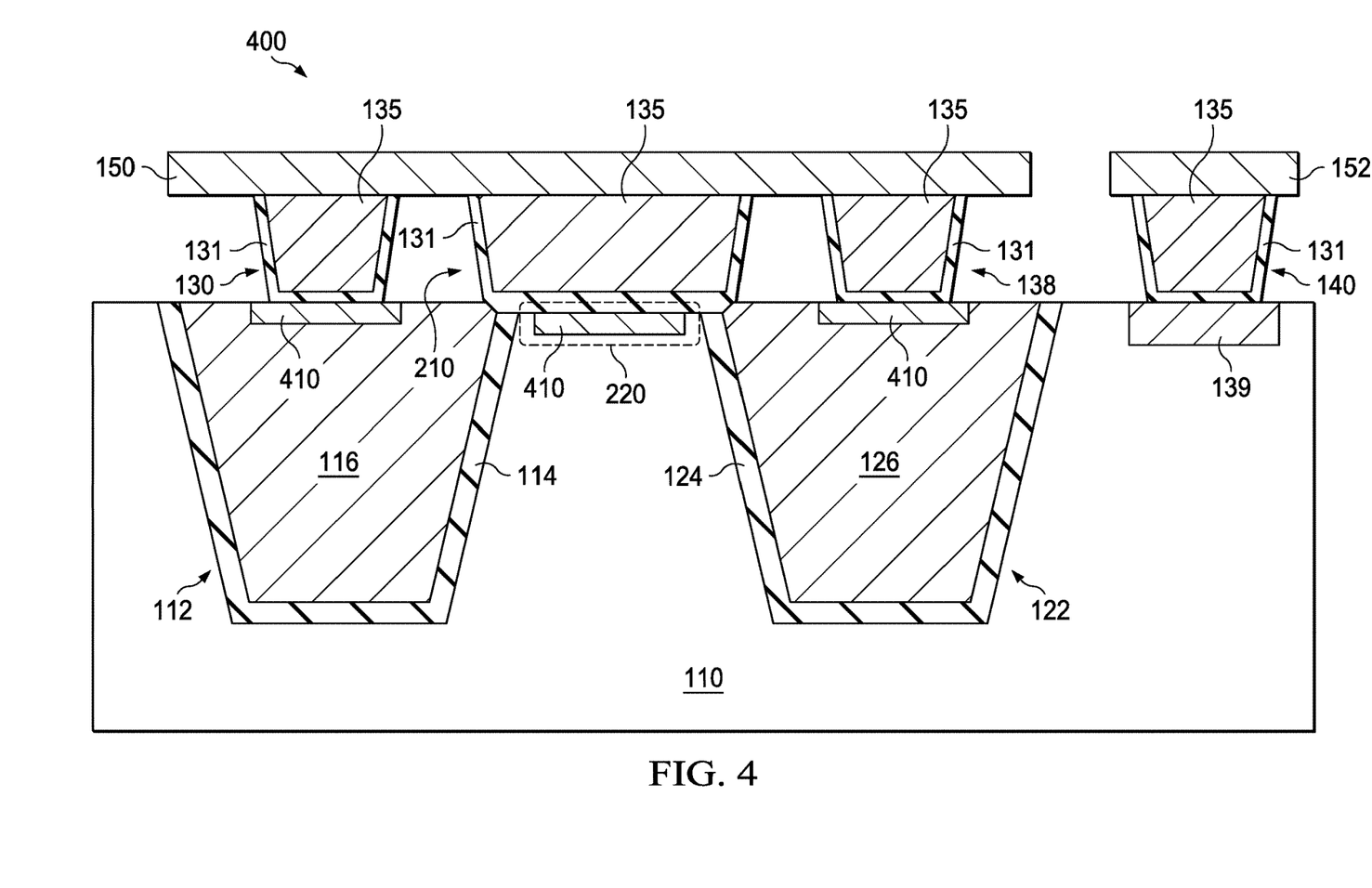
FIG. 4 illustrates another example of a Schottky diode.

FIG. 4 shows an example of a Schottky diode 400 similar to that of FIG. 2, but with a silicide 410 formed between the Ti/TiN layer 131 and the semiconductor substrate 110 for plug 210 and between plugs 130 (and 138) and polysilicon 116 (and 126). Silicides that have a barrier height large enough to form the Schottky contact 220 can be used. In one example, the silicide comprises palladium silicide or platinum silicide.

Figure 5:
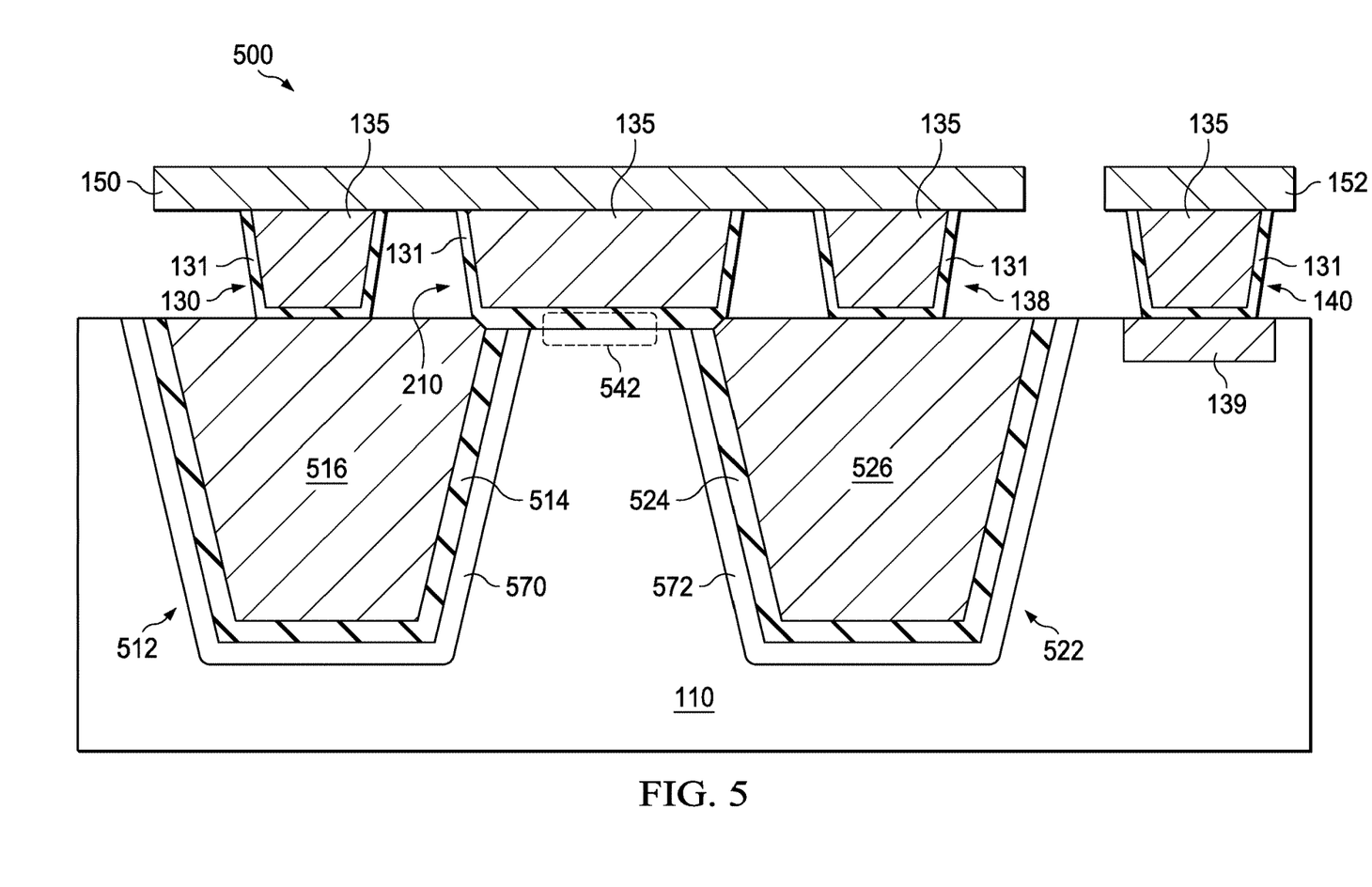
FIG. 5 illustrates a Schottky diode in accordance with another example.

In the examples of FIGS. 1 and 2, the Schottky diodes 100 and 200 included relatively small doped semiconductor regions 170 and 172 near the top surface of the semiconductor substrate 110 and near the Schottky contact regions 142. FIG. 5 shows an example Schottky diode 500 similar that of FIG. 2, but with two trenches 512 and 522, and each trench has a doped region extending all the way around the trench. That is trench 512 has a doped region 570 (e.g., p-doped) surrounding the trench, and trench 522 has a doped region 572 (e.g., p-doped) surrounding the trench. As for trenches 112 and 122, trenches 512 and 522 are filled with polysilicon 516, 526 and a dielectric layer 514, 524 (e.g., oxynitride) is disposed between the trenches' polysilicon and outer doped region. The doped regions 570, 572 are formed as implants after the trenches 512, 522 are etched. After the doped regions are implanted, the dielectric layers 514, 524 are formed and then polysilicon fills the trenches.

The p-doped regions 570, 572 and the n-doped substrate 110 form p-n junctions, which when reverse biased reduces the electric field in the region 542 where the Schottky contact is formed, thereby resulting in lower reverse leakage current compared to, for example, the Schottky diode 200 of FIG. 2, all else being equal. However, because the doped regions 570, 572 are larger than in the examples of FIGS. 1 and 2, the parasitic capacitance formed between the plug 210 and the doped region 570, 572 is larger than would be the case for Schottky diodes 100 and 200. The larger capacitance results in a slower switching speed of Schottky diode 500 than Schottky diodes 100, 200, but Schottky diode 500 will have a smaller reverse leakage current than for Schottky diodes 100, 200.

Figure 6:
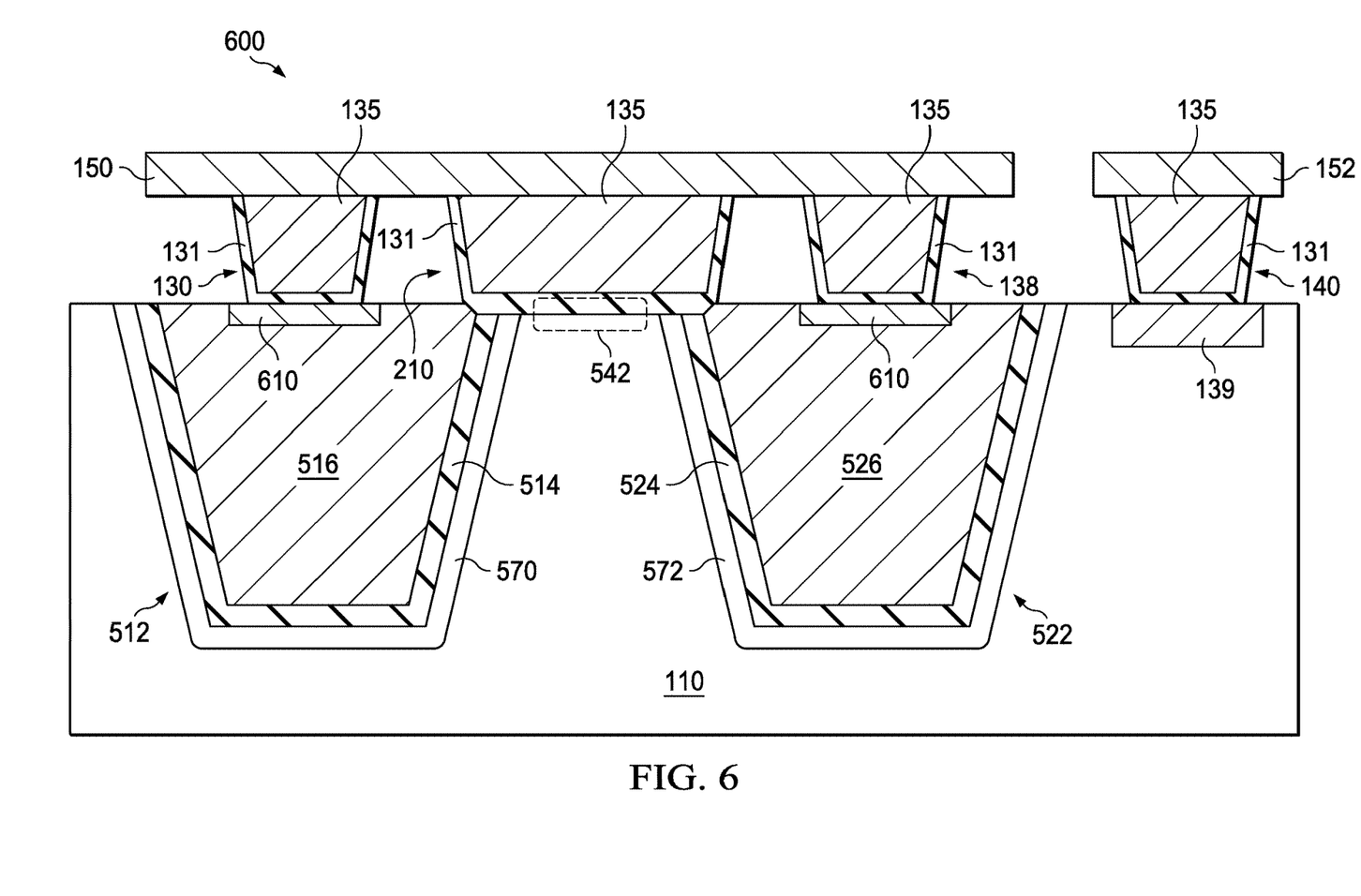
FIG. 6 illustrates a Schottky diode in accordance with another example.

FIG. 6 shows an example of a Schottky diode 600 similar to Schottky diode 500 of FIG. 5 but including silicide 610 between plug 130 and polysilicon 516 and between plug 138 and polysilicon 526. In one example, the silicide comprises palladium silicide or platinum silicide.

Figure 7:
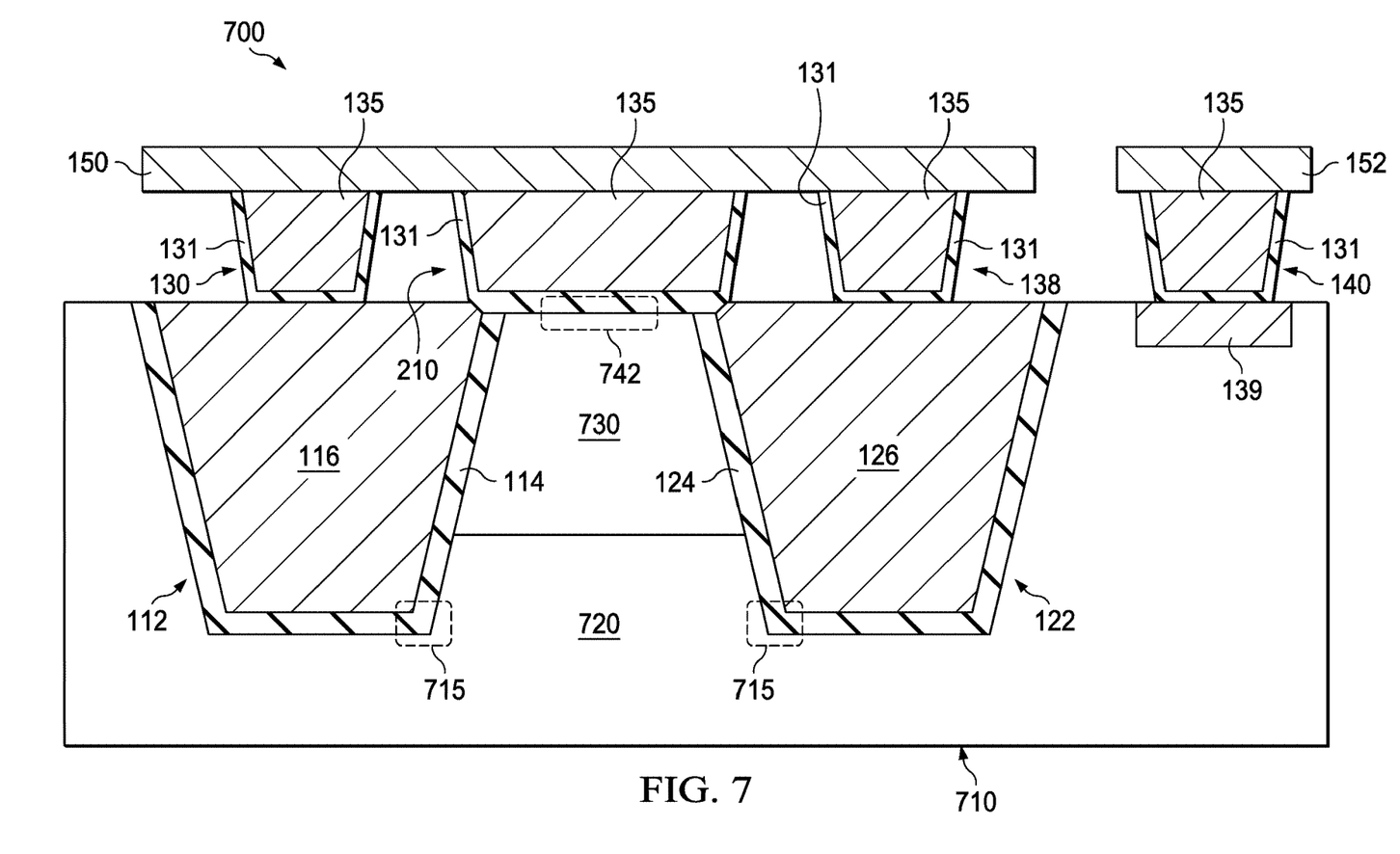
FIG. 7 illustrates a Schottky diode in accordance with another example.

FIG. 7 shows an example of a Schottky diode 700 similar to Schottky diode 200 of FIG. 2 but the semiconductor substrate 710 includes multiple regions of different doping concentrations. In the example of FIG. 7, the substrate 710 includes regions 730 and 720. Region 730 is formed between the plug 210 and the region 720. In one example, regions 720 and 730 are both N-doped but the doping concentration is greater in region 730 than in region 720. The electric field will be strongest in regions 715 near the bottom of the trenches 112, 122, and the lower doped region 720 helps to further reduce the electric field in regions 715 than if a higher doped semiconductor substrate was used.

Figure 8:
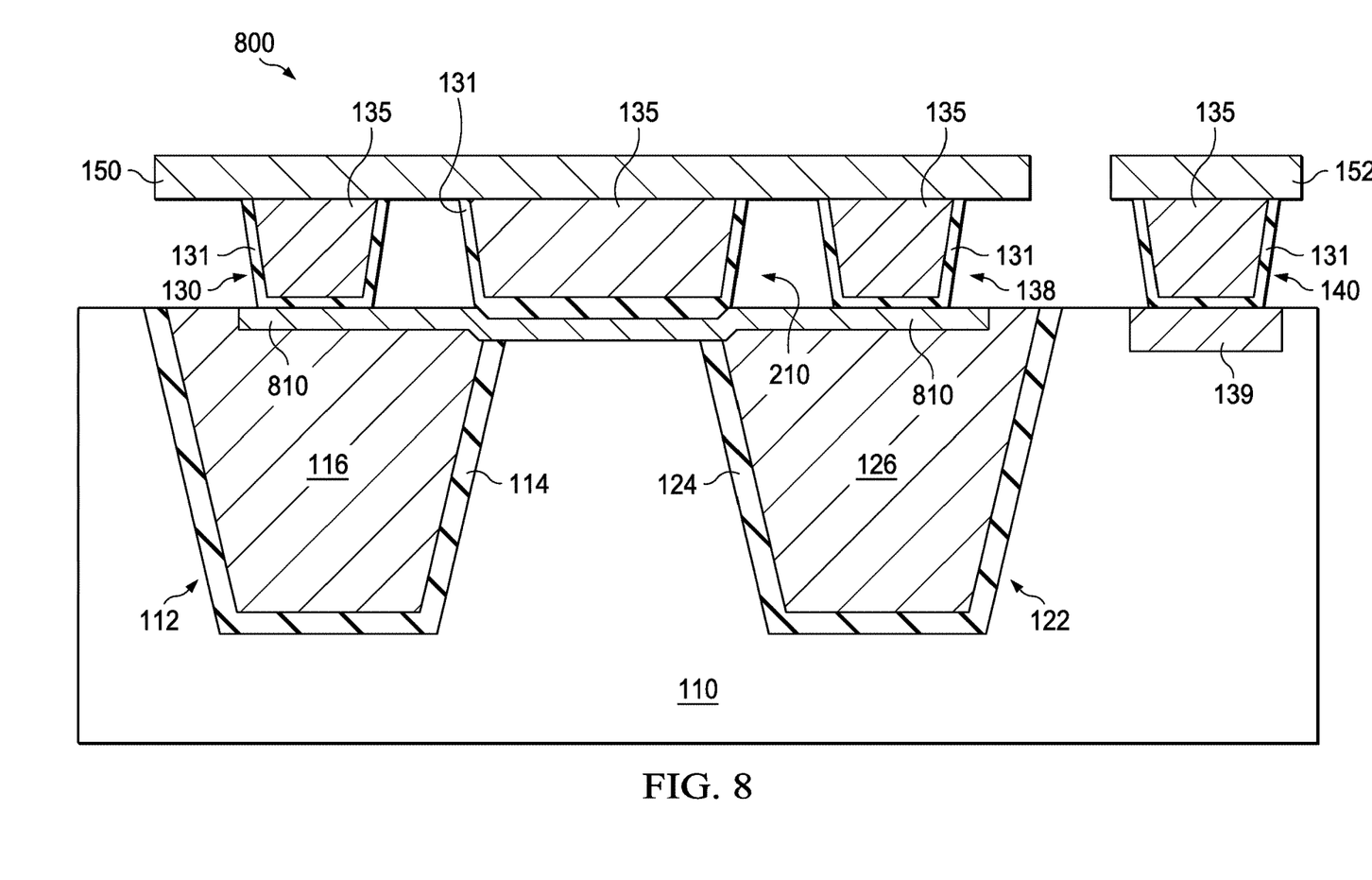
FIG. 8 illustrates another example of a Schottky diode.

FIG. 8 shows an example of a Schottky diode 800 similar to Schottky diode 200 of FIG. 2 but with a silicide 810 (e.g., palladium silicide, platinum silicide, etc.) formed across both trenches 112 and 122, rather than separate silicide regions as in the examples of FIGS. 4 and 6. A larger silicide area helps to improve the contact resistance between Ti/TiN layer 131 of plugs 130, 210 and 138 and the corresponding polysilicon 116, substrate 110, and polysilicon 126.

Figure 9:
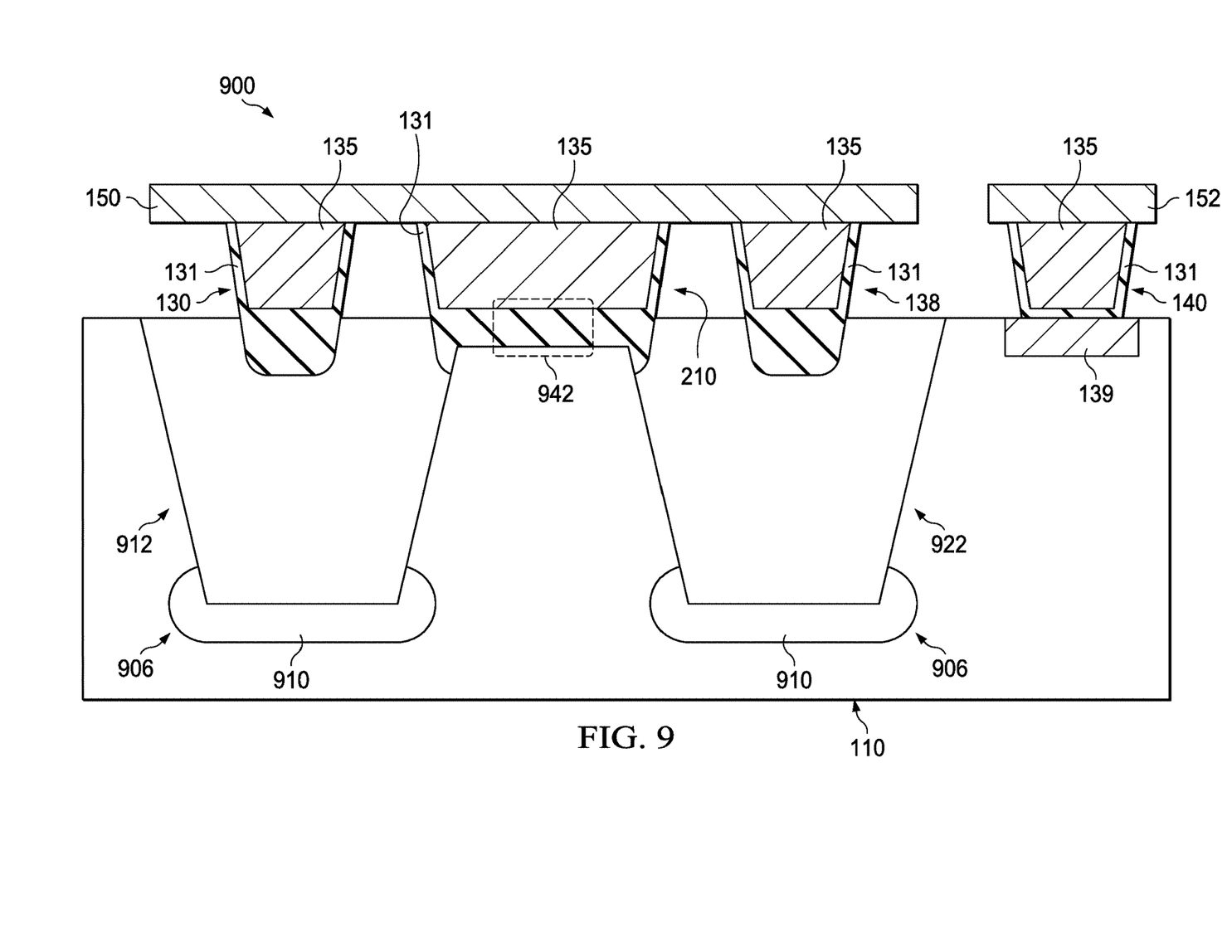
FIG. 9 illustrates another example of a Schottky diode.

FIG. 9 shows an example of a Schottky diode 800 similar to Schottky diode 200 of FIG. 5 but with implant regions 910 at or around the bottom 906 of trenches 912 and 922. The implant regions 910 are oppositely doped from the substrate 110. For example, the substrate 110 is N-doped and the implant regions 910 are P-doped. The p-n junctions formed between P-doped implant regions 910 and the N-doped substrate help to increase the reverse breakdown voltage of the Schottky diode 900 relative to, for example, Schottky diode 200. However, the implant regions 910 do not extend all of the way up the sides of the trenches 912, 924 to the region 942 of the Schottky contact, as was the case for the example Schottky diode 500 of FIG. 5.

What is claimed is:

1. A structure, comprising:
   a first trench in a semiconductor substrate, the first trench including polysilicon;
   a second trench in the semiconductor substrate, the second trench including polysilicon, the polysilicon oppositely doped from the semiconductor substrate;
   a Schottky contact formed by a first contact plug on the semiconductor substrate between the first and second trenches; and
   an anode electrode on the Schottky contact, the anode electrode coupled to and separated from the polysilicon in the first and second trenches by a second contact plug.

2. The structure of claim 1, wherein the semiconductor substrate is n-doped and the polysilicon in the first and second trenches is p-doped.

3. The structure of claim 1, further comprising a dielectric layer between the polysilicon in the first trench and the semiconductor substrate and between the polysilicon in the second trench and the semiconductor substrate.

4. The structure of claim 3, further comprising a doped region in the semiconductor substrate between the dielectric layer of the first trench and the Schottky contact and between the dielectric layer of the second trench and the Schottky contact.

5. The structure of claim 4, wherein the doped region is doped opposite that of the semiconductor substrate.

6. The structure of claim 1, further comprising a doped region in the semiconductor substrate between the polysilicon of the first trench and the Schottky contact and between the polysilicon of the second trench and the Schottky contact.

7. The structure of claim 6, wherein the doped region lines the first and second trenches.

8. The structure of claim 1, further comprising a cathode electrode coupled to a metal layer within a surface of the semiconductor substrate.

9. A device, comprising:
a first trench disposed in a semiconductor substrate;
a second trench disposed in the semiconductor substrate; and
a first contact plug disposed between the first trench and the second trench, the first contact plug forming a Schottky contact;
a second contact plug disposed on the first trench; and
an anode electrode disposed over the first contact plug and the second contact plug.

10. The device of claim 9, further comprising a junction region adjacent to the first trench.

11. The device of claim 10, wherein the first contact plug contacts the junction region.

12. The device of claim 9, wherein the first trench comprises polysilicon, the polysilicon oppositely doped from the semiconductor substrate.

13. The device of claim 12, wherein the first trench further comprises oxynitride disposed between the polysilicon and the semiconductor substrate.

14. The device of claim 9, wherein the first contact plug comprises a titanium-based barrier layer.

15. The device of claim 9, wherein the second contact plug suspends the anode electrode from the semiconductor substrate.

16. The device of claim 9, wherein the first trench comprises oxynitride disposed between a layer of polysilicon and a doped region, and the doped region is disposed between the semiconductor substrate and the oxynitride.

17. The device of claim 9, wherein the first trench comprises silicide contacting the second contact plug.

18. The device of claim 9, further comprising a doped region disposed between the first trench and the second trench, wherein the doped region comprises a doping concentration higher than the semiconductor substrate.

19. The device of claim 9, wherein the second contact plug extends into the first trench.

20. A structure, comprising:
a first trench;
a second trench;
a metal layer, the metal layer forming an anode electrode disposed over the first trench and the second trench and a cathode electrode;
a first contact plug between the anode electrode and the first trench;
a second contact plug between the anode electrode and a substrate between the first trench and second trench, the second contact plug directly contacting the substrate;
a third contact plug between the anode electrode and the second trench; and
a fourth contact plug extending from the cathode electrode to the substrate on an opposite side of the second trench from the second contact plug.

21. A structure, comprising:
a first trench in a semiconductor substrate, the first trench including polysilicon;
a second trench in the semiconductor substrate, the second trench including polysilicon, the polysilicon oppositely doped from the semiconductor substrate;
a Schottky contact formed by a titanium barrier of a contact plug on a silicide region of the semiconductor substrate between the first and second trenches; and
an anode electrode on the Schottky contact, the anode electrode coupled to and separated from the polysilicon in the first and second trenches by the contact plug.

* * * * *